US012039097B1

(12) United States Patent
Velesko (10) Patent No.: US 12,039,097 B1
(45) Date of Patent: Jul. 16, 2024

(54) METHOD AND SYSTEM FOR GATHERING AND ANALYZING MOTION DATA

(71) Applicant: Paulius Velesko, North Las Vegas, NV (US)

(72) Inventor: Paulius Velesko, North Las Vegas, NV (US)

( * ) Notice: Subject to any disclaimer, the term of this patent is extended or adjusted under 35 U.S.C. 154(b) by 0 days.

(21) Appl. No.: 18/118,165

(22) Filed: Mar. 7, 2023

(51) Int. Cl.
   *G06F 3/01* (2006.01)
   *G01R 33/24* (2006.01)
   *G06F 3/03* (2006.01)

(52) U.S. Cl.
   CPC .............. *G06F 3/011* (2013.01); *G01R 33/24* (2013.01); *G06F 3/03* (2013.01)

(58) Field of Classification Search
   None
   See application file for complete search history.

(56) References Cited

U.S. PATENT DOCUMENTS

| 10,606,355 | B1* | 3/2020 | Zhang | G06F 3/046 |
| 11,169,607 | B1* | 11/2021 | Tompkins | G06F 3/014 |
| 2017/0046979 | A1* | 2/2017 | Lehary | A61B 5/1123 |
| 2018/0343024 | A1* | 11/2018 | Sahebjavaher | H04M 1/0202 |
| 2022/0066565 | A1* | 3/2022 | Sapozhnik | H04B 10/90 |
| 2022/0212780 | A1* | 7/2022 | Lawniczak | G06F 3/016 |
| 2023/0314536 | A1* | 10/2023 | Flansberry | G01R 33/26 324/302 |

* cited by examiner

*Primary Examiner* — Matthew Yeung
(74) *Attorney, Agent, or Firm* — Sam Pierce (57) ABSTRACT

A method and system for tracking two objects in relative motion to each other is provided. The two objects can be worn on any body parts, for example the lower limbs or upper limbs of a user, and the two objects include tracking devices. The system tracks movement of the user in a physical space and obtains sensor data from the tracking devices. Further, the system transmits the sensor data to a computing device for processing to generate feedback data and data representing virtual objects corresponding to the two objects. The virtual objects are capable of being rendered in a virtual environment presented on the computing device. Further, the system includes a feedback module to provide feedback to the user when some behaviour of interest is detected such as not covering one's face, dropping the hands, etc.

27 Claims, 9 Drawing Sheets

METHOD AND SYSTEM FOR GATHERING AND ANALYZING MOTION DATA

TECHNICAL FIELD

The present invention relates generally to motion tracking systems, and more particularly, to a method and system for gathering and analyzing motion data of an object.

BACKGROUND

In the past decade, there has been significant growth in various motion capturing systems. The motion capturing systems obtain data regarding the location and movement of a human or other object in a physical space and can use the data as an input to an application in a computing system for analysis. Many applications are possible, such as for military, computer games, entertainment, sports, and medical purposes. Many currently available data capture and analysis devices for athletes are intrusive to the athlete's performance. An athlete's wearables are designed for maximum mobility and protection and should not hinder the performance of the athlete. As a result, the devices may not be effectively used in motion tracking and performance analysis of the athlete.

Further, most of the available data capture and analysis devices only display analysis data and may not provide feedback to the athlete. As on time feedback is crucial for improving the performance of the athlete, integration of feedback system to the existing data capture and analysis devices is desirable.

To address the scenario discussed above, U.S. Pat. No. 8,622,795B2 discloses a computer-implemented method that analyzes the activity of an athlete to permit qualitative assessments of that activity using a processor. The method comprises receiving activity-related data from sensors on the athlete. A database stores the activity-related data. The processor compares the received activity-related data against a set of pre-identified discrete outcomes. The processor identifies by the processor one of the pre-identified outcomes as corresponding to the received activity-related data based on the comparison of the received activity-related data against the set of pre-identified outcomes. The identified pre-identified outcome is displayed.

Further, U.S. Pat. No. 8,465,108B2 discloses a motion capture system that can be used to create a performance in a virtual space which is displayed on a display device. A person's movement is tracked in the field of view of a depth camera and used as an input to an application that provides the virtual space. The person can be directed to perform the movements by a coaching avatar, or visual or audio cues in the virtual space. The application can respond to the detected movements and voice commands or voice volume of the person to define avatar traits and initiate pre-scripted audiovisual events in the virtual space to provide an entertaining experience.

Currently, none of the existing systems and methods can provide an improved motion tracking system which can be easily integrated into the athlete's wearables and does not hinder the performance of the athlete. Further, none of the existing systems and methods can provide real-time feedback to the athlete when some undesired behavior is detected.

Although motion tracking methods and systems are proposed in the past, they have their own shortcomings or limitations, thus there still exists a need for a more reliable solution which can provide an improved data capture and analysis system that does not interfere with a user's actions. Accordingly, proposed is a method and system for gathering and analysing motion data of an object in a non-intrusive fashion.

SUMMARY

It will be understood that this disclosure is not limited to the particular systems, and methodologies described, as there can be multiple possible embodiments of the present disclosure which are not expressly illustrated in the present disclosure. It is also to be understood that the terminology used in the description is for the purpose of describing the particular versions or embodiments only and is not intended to limit the scope of the present disclosure.

In an embodiment, the present invention provides a system and method for tracking two or more objects in relative motion to each other. The system includes a first tracking device attachable to a first object worn on a first body part of a user, wherein the first tracking device comprises at least a first system on a chip (SoC) microcontroller, a first group of sensors, and a magnet. Further, the system includes a second tracking device attachable to a second object worn on a second body part of the user, wherein the second tracking device comprises at least a second system on a chip (SoC) microcontroller, a second group of sensors. Further, a first processor of the first SoC microcontroller of the first tracking device configured to obtain a first sensor data from the first group of sensors. Further, a second processor of the second SoC microcontroller of the second tracking device configured to obtain a second sensor data from the second group of sensors. Further, a first transmitter of the first SoC microcontroller and a second transmitter of the second SoC microcontroller configured to transmit the first sensor data and the second sensor data derived from the first group of sensors and the second group of sensors to one or more devices for processing to generate at least feedback data and data representing virtual objects corresponding to the first object and the second object, the virtual objects being capable of rendered in a virtual environment presented on the one or more devices.

In an embodiment, the first object and the second object worn on the first and second body part of the user comprises at least gloves, shin guards, leg guards, a helmet, a wristband a headband or other article that can be worn.

In an embodiment, the first group of sensors comprises at least a first accelerometer sensor, and a first angular rate sensor.

In an embodiment, the second group of sensors comprises at least a second accelerometer sensor, a second angular rate sensor, and a magnetometer sensor.

In an embodiment, the magnet is an electromagnet or a conventional dipole magnet.

In an embodiment, the processing of the first sensor data and the second sensor data at the one or more devices includes the steps of receiving the first sensor data and the second sensor data derived from the first group of sensors and the second group of sensors, and determining whether a value of the magnetometer sensor reading from the second sensor data is higher than a threshold value. Further, if it is determined that the value of the magnetometer sensor reading is higher than the threshold value, tracking position data of the first object and the second object in relative motion to each other based on the magnetometer sensor reading from the second sensor data, and tracking orientation data of the first object and the second object in relative motion to each other based on a sensor data derived from the first accelerometer sensor, the second accelerometer sensor, the first angular rate sensor, and the second angular rate sensor. Furthermore, if it is determined that the value of the magnetometer sensor reading is lower than the threshold value, the tracking position data, and the orientation data of the first object and the second object in relative motion to each other based on a sensor data derived from the first accelerometer sensor, the second accelerometer sensor, the first angular rate sensor, and the second angular rate sensor. Additionally, if it is determined that the value of the magnetometer sensor reading is higher than the threshold value, tracking the position data of the first object and the second object in relative motion to each other based on a sensor data derived from the first accelerometer sensor, the second accelerometer sensor, the first angular rate sensor, the second angular rate sensor, and the magnetometer sensor, and tracking the orientation data of the first object and the second object in relative motion to each other based on a sensor data derived from the first accelerometer sensor, the second accelerometer sensor, the first angular rate sensor, and the second angular rate sensor.

In an embodiment, the processing of the first and second sensor data at the one or more devices further includes tracking the location of the first and second object relative to a magnet or electromagnet using a periodic drift compensation performed by calculating direction and distance of the first and second object being tracked with respect to the magnet or electromagnet using magnetic field strengths.

In an embodiment, generating the data representing virtual objects corresponding to the first and second objects based on the tracking data of the first and second objects in relative motion to each other, wherein the virtual objects are capable of being rendered in the virtual environment presented on the one or more devices.

In an embodiment, the threshold value depends on the type of the magnet, the shape of the magnet, size of the magnet, and the current inflow and shape of the electromagnet.

In an embodiment, the virtual objects rendered in the virtual environment in a manner that the first virtual object, and the second virtual object are centered around the origin of a three-dimensional (3D) Cartesian plane, or the first virtual object is centered at the origin and the second virtual object is on any plane of the 3D Cartesian plane.

In an embodiment, the system further includes a feedback module configured to provide feedback to the user during a user's session, wherein the feedback is provided corresponding to a behaviour of interest.

In an embodiment, the feedback corresponding to the behaviour of interest can be customized by the user in an application related to the tracking system.

In an embodiment, the feedback comprises at least one of audio feedback, visual feedback, and tactile feedback.

These and other features and advantages of the present invention will become apparent from the detailed description below, in light of the accompanying drawings.

DETAILED DESCRIPTION

As used in the specification, the singular forms "a", "an" and "the" may also include plural references. For example, the term "an article" may include a plurality of articles. Those with ordinary skill in the art will appreciate that the elements in the figures are illustrated for simplicity and clarity and are not necessarily drawn to scale. There may be additional components or processes described in the foregoing application that are not depicted on the described drawings. In the event such a component or process is described, but not depicted in a drawing, the absence of such component and process from the drawings should not be considered as an omission of such design from the specification.

Before describing the present invention in detail, it should be observed that the present invention utilizes a combination of components or processes, which constitutes a system and method for tracking two objects in relative motion to each other. Accordingly, the components or processes have been represented, showing only specific details that are pertinent for an understanding of the present invention so as not to obscure the disclosure with details that will be readily apparent to those with ordinary skill in the art having the benefit of the description herein. As required, detailed embodiments of the present invention are disclosed herein; however, it is to be understood that the disclosed embodiments are merely exemplary of the invention, which can be embodied in various forms. Therefore, specific component level details and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

References to "one embodiment", "an embodiment", "another embodiment", "one example", "an example", "another example", "yet another example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment. The words "comprising", "having", "containing", and "including", and other forms thereof, are intended to be equivalent in meaning and be open ended in that an item or items following any one of these words is not meant to be an exhaustive listing of such item or items or meant to be limited to only the listed item or items. Further, the word "user" and "person" are used interchangeably in the description.

The system and method for tracking two objects in relative motion to each other will now be described with reference to the accompanying drawings, particularly FIGS. 1-11.

Figure 1:
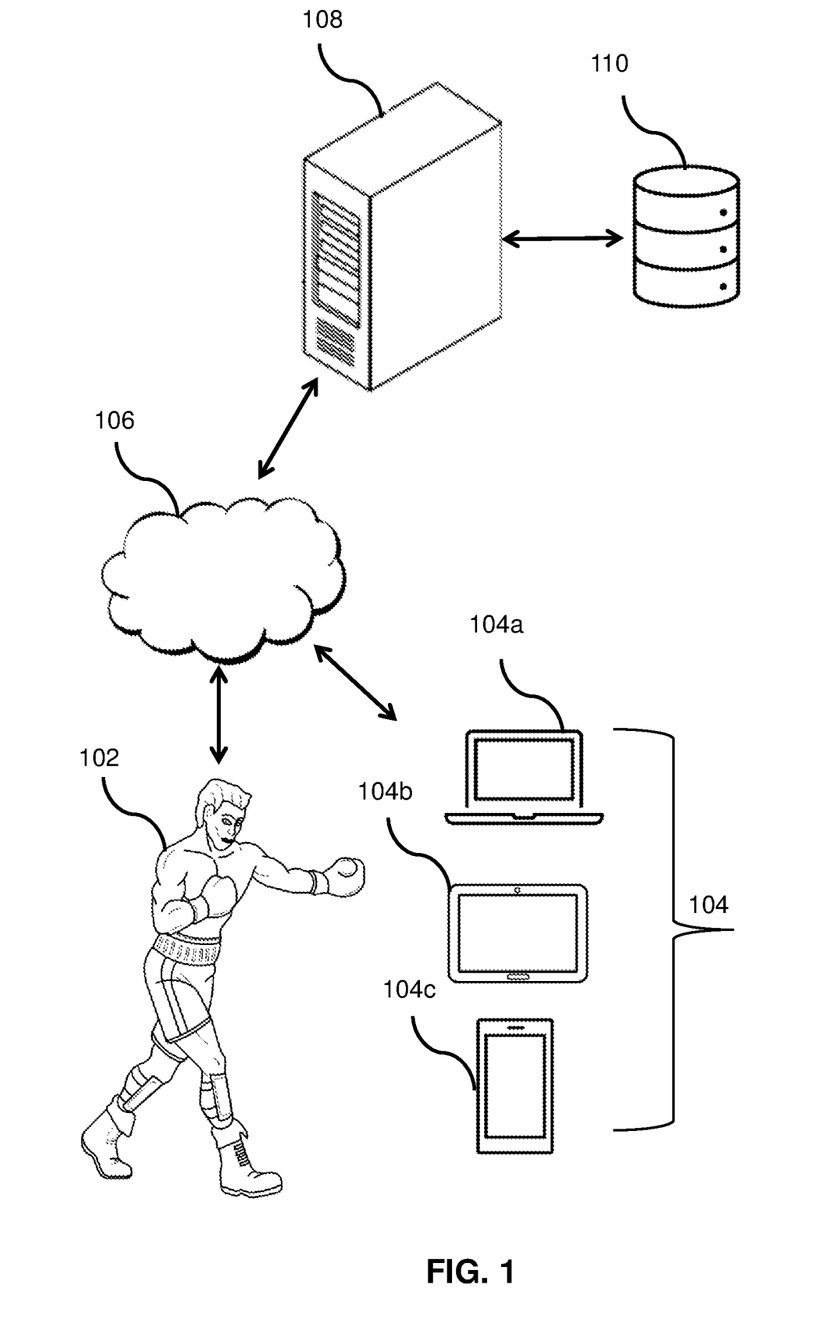
FIG. 1 illustrates a computing environment or general implementation for tracking at least two objects in relative motion to each other, according to an exemplary embodiment of the present invention.

Referring to FIG. 1 in conjunction with FIGS. 2-11, a system 100 for tracking at least two objects in relative motion to each other is shown, in accordance with an exemplary embodiment of the present invention. The system 100 includes a user 102 who can wear the objects on his/her limbs or any other body parts. In an embodiment, the wearable product (i.e., objects) worn on the limbs of the user includes at least gloves, shin guards, and leg guards. In an embodiment, the limbs of the user are lower limbs or upper limbs. Examples of the user include, but are not limited to a gamer, an athlete, or any person who wears a tracking device. In a scenario, the exemplary system 100 can be used for capturing and analysing motion-related data of an athlete 102. The exemplary system 100 can include, among other components, at least two tracking devices which can be attached to the objects, for example, gloves. In an embodiment, the tracking device(s) can be attached directly to a body part of the user 102. In that case, the system 100 can track position and orientation of the tracking devices which are attached directly to a body part of the user 102 instead of the two objects.

In an embodiment, a first tracking device is attachable to a first object, for example, a right glove worn on a first limb, for example, the right hand of the user 102. The first tracking device includes at least a first system on a chip (hereinafter termed as SoC) microcontroller, a first accelerometer sensor, a first angular rate sensor, and a magnet or an electromagnet. A block diagram of the first tracking device is described in conjunction with FIG. 2. In an embodiment, a second tracking device is attachable to a second object, for example, a left glove worn on a second limb, for example, the left hand of the user 102. The second tracking device includes at least a second SoC microcontroller, a second accelerometer sensor, a second angular rate sensor, and a magnetometer sensor. A block diagram of the first tracking device is described in conjunction with FIG. 3. In an embodiment, the first SoC microcontroller includes, among other components, a first processor and a first transmitter. Similarly, the second SoC microcontroller includes, among other components, a second processor and a second transmitter. A block diagram of the SoC microcontroller is described in conjunction with FIG. 4.

In an embodiment, the first processor of the first SoC microcontroller of the first tracking device is configured to obtain a first sensor data from the first accelerometer sensor, and the first angular rate sensor. Similarly, the second processor of the second SoC microcontroller of the second tracking device is configured to obtain a second sensor data from the second accelerometer sensor, the second angular rate sensor, and the magnetometer sensor. In an example, the first processor is configured to collect data regarding acceleration, force, orientation, or impact.

In an embodiment, the first transmitter of the first SoC microcontroller and the second transmitter of the second SoC microcontroller are configured to transmit the first sensor data and the second sensor data derived from the first accelerometer sensor, the second accelerometer sensor, the first angular rate sensor, the second angular rate sensor and the magnetometer sensor to a computing device 108 for processing to generate at least feedback data and data representing virtual objects corresponding to the first object and the second object. The virtual objects are capable of being rendered in a virtual environment presented on the computing device 108 or one or more devices 104.

In one example, the computing device 108 connected to the tracking devices (i.e., the first tracking device and the second tracking device) via a communication network 106 can execute a data capture application, data analysis software, and a visualization engine. In the context of the present invention, the one or more devices 104 refers to an electronic device that can be used to communicate over the communication network 106. As shown, the one or more devices 104 includes a laptop 104a, a personal digital assistant (PDA) 104b, and a smart phone 104c. Examples of the computing device 108 include, but are not limited to a cell phone, a smart phone, a cellular phone, a cellular mobile phone, a personal digital assistant (PDA), a personal computer, a server, a cloud enabled devices, a laptop, a smart television, and a tablet computer. Examples of types of the communication network 106 include, but are not limited to a local area network, a wide area network, a radio network, a virtual private network, an internet area network, a metropolitan area network, a satellite network, Wi-Fi, Bluetooth Low energy, a wireless network, and a telecommunication network. Examples of the telecommunication network include, but are not be limited to a global system for mobile communication (GSM) network, a general packet radio service (GPRS) network, third Generation Partnership Project (3GPP), 4G, Long-Term Evolution (LTE), an enhanced data GSM environment (EDGE) and a Universal Mobile Telecommunications System (UMTS).

Further, the computing device 108 is connected to a storage device 110. The data capture application receives the first sensor data and the second sensor data from the first transmitter of the first SoC microcontroller and the second transmitter of the second SoC microcontroller and stores them in a memory, such as RAM, a hard drive, a database, or flash memory. The data analysis software compares the value of the magnetometer reading with a pre-determined threshold value. In an embodiment, the threshold value depends on the type of magnet, the shape of the magnet, and the size of the magnet used in the first tracking device and the background magnetic noise of the location where tracking is performed. If it is determined that the value of the magnetometer sensor reading is higher than the threshold value, tracking position data of the two objects (for example, a first object and a second object) in relative motion to each other based on the magnetometer sensor reading from the second sensor data, and tracking orientation data of the first object and the second object in relative motion to each other based on a sensor data derived from the first accelerometer sensor, the second accelerometer sensor, the first angular rate sensor, and the second angular rate sensor. Most of the time the above sensor data is used for analysis as the natural state of the boxer is to keep the guard up with hands close together and covering the face. In an embodiment, the threshold value depends on the type of the magnet, the shape of the magnet, size of the magnet, and the current inflow and shape of the electromagnet.

Further, if it is determined that the value of the magnetometer is lower than the threshold value, the two objects are tracked based on the sensor data derived from the first accelerometer sensor, the second accelerometer sensor, the first angular rate sensor, and the second angular rate sensor. The above analysis occurs when a punch/kick is performed. Since punches are fast, the time spent in integration mode (i.e., when the accelerometer sensor and the angular rate sensor are active, and magnetic reading becomes too small compared to the background magnetic noise) is small and thus small error (termed as drift herein after) accumulation is expected. The drift accumulates at the rate of $t^3$, where 't' is time.

In an embodiment, the proposed system compensates the drift by operating in two modes. The two modes of operation are as follows:

Magnetometer Mode: The magnetometer mode is applicable when the distance between two objects is relatively small. Generally, the magnetic field strength varies with respect to the distance between two objects as $1/r^3$ where r is the distance between two objects. In this mode, the system can calculate the distance between the two objects using magnetic field strength values. Furthermore, the direction can be found from the magnetometer sensor as the magnetometer sensor gives a direction vector <x, y, z>. for example, a resulting vector pointing to the magnet. The magnet can be a regular dipole magnet such as N52 or the electromagnet that can be used by applying current to a coil. The electromagnet could generate much stronger magnetic fields. Furthermore, the system needs one strong reading to correct the current location estimate, hence, the electromagnet could be used sporadically. The sporadic use would enable the electromagnet to generate a much stronger field from a low-power system using capacitors/batteries to store a charge.

IMU/Integration mode: The acceleration readings from the accelerometer and angular acceleration readings from the gyroscope can be integrated to gain (regular/angular) velocity and then integrated again to gain position/rotation.

Conventional methods and systems that rely solely on accelerometer and/or gyroscope (IMU) use numeral methods for compensating the drift and try to minimize the accumulation of error. However, the proposed method, relies on objects coming back close together frequently, uses the magnet and the magnetometer combination to obtain accurate position data. This method combines the use of drift-free method of obtaining position using reading magnetic field strength between the magnet and the magnetometer for short ranges and the use of IMU tracking when the objects are further apart. This is why this method is best applied to cases where the objects tend to return to their original position. The return to original position maximizes the time spent magnet mode and minimize the time spent in IMU mode.

Further, if it is determined that the value of the magnetometer sensor reading is higher than the threshold value, tracking the position data of the first object and the second object in relative motion to each other based on a sensor data derived from the first accelerometer sensor, the second accelerometer sensor, the first angular rate sensor, the second angular rate sensor, and the magnetometer sensor, and tracking the orientation data of the first object and the second object in relative motion to each other based on a sensor data derived from the first accelerometer sensor, the second accelerometer sensor, the first angular rate sensor, and the second angular rate sensor.

In another embodiment, the proposed system 100 can track one or more objects where the first tracking device contains the magnet/electromagnet and no other sensors, and the second tracking device or other tracking devices orient themselves in 3D space around this first tracking device.

The proposed method relies on the readings of the magnetic field to determine the distance between the two objects or between one or more objects that are in relative motion to each other. To do this accurately, the system 100 can be calibrated prior to use to consider the background magnetic noise at the location where it will be used. The calibration procedure takes place by placing the tracking devices in a sequence pre-determined position relative to one another and taking the magnetic readings. At least ¾ such readings can be taken by the system and can place these readings in a virtual 3d space which gives known magnetic fields at X number of 3D locations. These readings can then be interpolated to fill the remainder of points in the virtual 3D space, effectively giving the system a good estimate of the magnetic field at any location in this bounded 3D space. When a magnetic field measurement is performed, the reading is subtracted from the noise at that given location to improve the accuracy of the magnetic reading.

The data analysis software then sends the results of its analysis to a visualization engine that displays data representing virtual objects corresponding to the first object and the second object. General implementation of displaying virtual objects corresponding to the object in the virtual environment presented on the computing device 108 or on the one more devices 104 is described in conjunction with FIG. 6. In an embodiment, the virtual objects are rendered in the virtual environment in a manner that the first virtual object and the second virtual object are centered around the origin of a three-dimensional (3D) Cartesian plane as described in conjunction with FIG. 7. In another embodiment, the virtual objects are rendered in the virtual environment in a manner that the first virtual object is centered at the origin and the second virtual object is on any plane of the 3D Cartesian plane. Each application can be on a single computing device or on separate computing devices connected through a network or the internet.

In an embodiment, the system 100 includes a feedback module that is configured to provide real time feedback to the user 102 when some behaviour of interest is detected. Examples of behaviour of interest includes, but not limited to uncovered face, and hands in down position. In an embodiment, the feedback data for the behaviour of interest can be customized by the user 102 in an application related to the tracking system that is installed on the computing device 108. In an embodiment, the real time feedback includes at least one of audio feedback, visual feedback, and tactile feedback. An example of receiving real time feedback by the user 102 is described in conjunction with FIG. 8.

Figure 2:
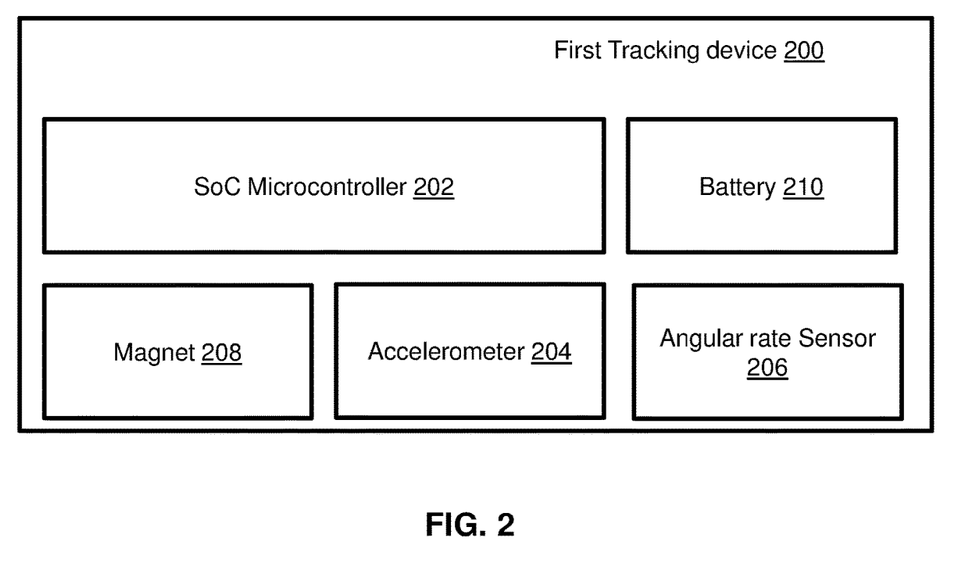
FIG. 2 is a block diagram illustrating a first tracking device, according to an embodiment of the present invention.

FIG. 2 is a block diagram illustrating the first tracking device 200, according to an embodiment of the present invention. In an embodiment, the first tracking device 200 includes at least the first SoC microcontroller 202, the first accelerometer sensor 204, the first angular rate sensor 206, the magnet 208, and a battery 210. The first accelerometer sensor 204 is an electronic sensor that measures the acceleration forces acting on the first tracking device 200, to determine the first object's position in space and monitor the first object's movement. The first angular rate sensor 206 is an electronic sensor that can measure and maintain the orientation and angular velocity of the first tracking device 200. Reading from the first accelerometer sensor 204 provides the gravity direction (which way is the ground). Reading from the first angular rate sensor 206 provides the rotation of the first object. In an embodiment, the first accelerometer sensor, and the first angular rate sensor are combinedly termed as a first group of sensors.

Further, the first SoC microcontroller 202 obtains the first sensor data from the first accelerometer sensor 204, and the first angular rate sensor 206 and transmits those data to the computing device 108 for processing. In an example, the first SoC microcontroller 202 is ESP 32 microcontroller. In an embodiment, the first SoC microcontroller 202 is attached to a flexible printed circuit board (PCB). The flexible PCB is helpful for tracking the one or more objects involved in a sport. The magnet 208 used in the first tracking device 200 may be N52 magnet or the electromagnet. The number abbreviation, N35, N42, N52, or N55 for example, indicates the strength, or energy product, of the magnet grade. The battery 210 supplies energy to the first tracking device 200. In an embodiment, the battery 210 is a Lithium battery. In one example, the first tracking device 200 may include a wireless charging coil for charging different components of the first tracking device 200.

Figure 3:
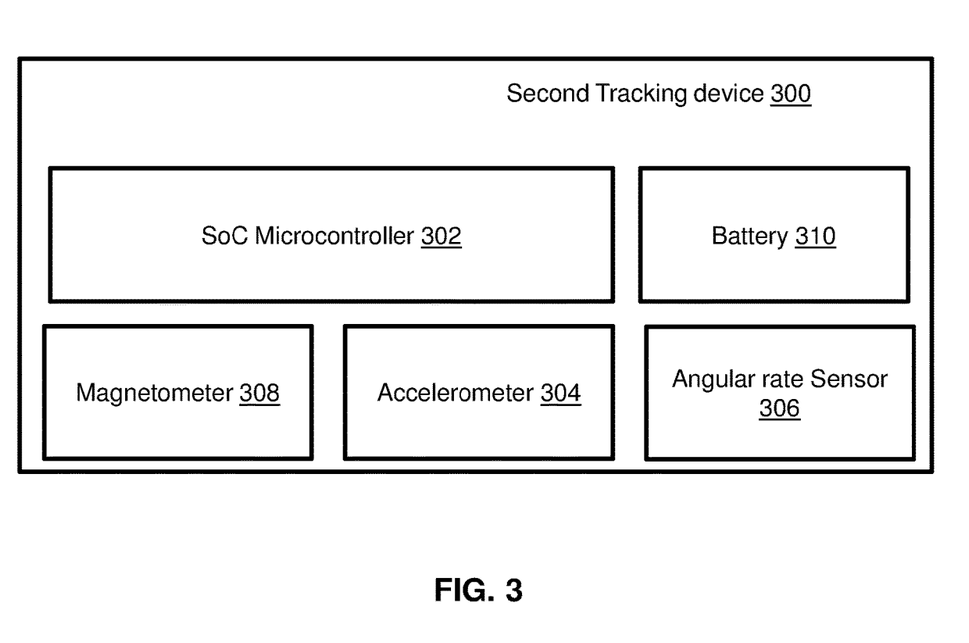
FIG. 3 is a block diagram illustrating a second tracking device, according to an embodiment of the present invention.

FIG. 3 is a block diagram illustrating the second tracking device 300, according to an embodiment of the present invention. In an embodiment, the second tracking device 300 includes at least the second SoC microcontroller 302, the second accelerometer sensor 304, the second angular rate sensor 306, the magnetometer 308, and a battery 310. The second accelerometer sensor 304 is an electronic sensor that measures the acceleration forces acting on the second tracking device 300, to determine the second object's position in space and monitor the second object's movement. The second angular rate sensor 306 is an electronic sensor that can measure the orientation and angular velocity of the second tracking device 300. Reading from the second accelerometer sensor 304 provides the gravity direction. Reading from the second angular rate sensor 306 provides the rotation of the second object. In an embodiment, the second accelerometer sensor, the second angular rate sensor, and the magnetometer sensor are combinedly termed as a second group of sensors.

Further, the second SoC microcontroller 302 obtains the second sensor data from the second accelerometer sensor 304, the second angular rate sensor 306, and the magnetometer 308. Furthermore, the second SoC microcontroller 302 transmits those data to the computing device 108 for processing. In an example, the second SoC microcontroller 302 is ESP 32 microcontroller. In an embodiment, the second SoC microcontroller 302 is attached to a flexible PCB. The magnetometer 308 is used to measure the magnetic field, particularly with respect to its magnetic strength and orientation. Magnetic field strength falls off with the square of the distance. Hence, the system 100 can measure the relative distance between the two objects (i.e., between two gloves) in a physical space. This relative distance can be used for rendering the virtual objects corresponding to the first object and the second object in the virtual environment presented on the computing device 108. Further, the battery 310 supplies energy to the second tracking device 300. In an embodiment, the battery 310 is a Lithium battery. In one example, the second tracking device 300 may include a wireless charging coil for charging different components of the second tracking device 300.

Figure 4:
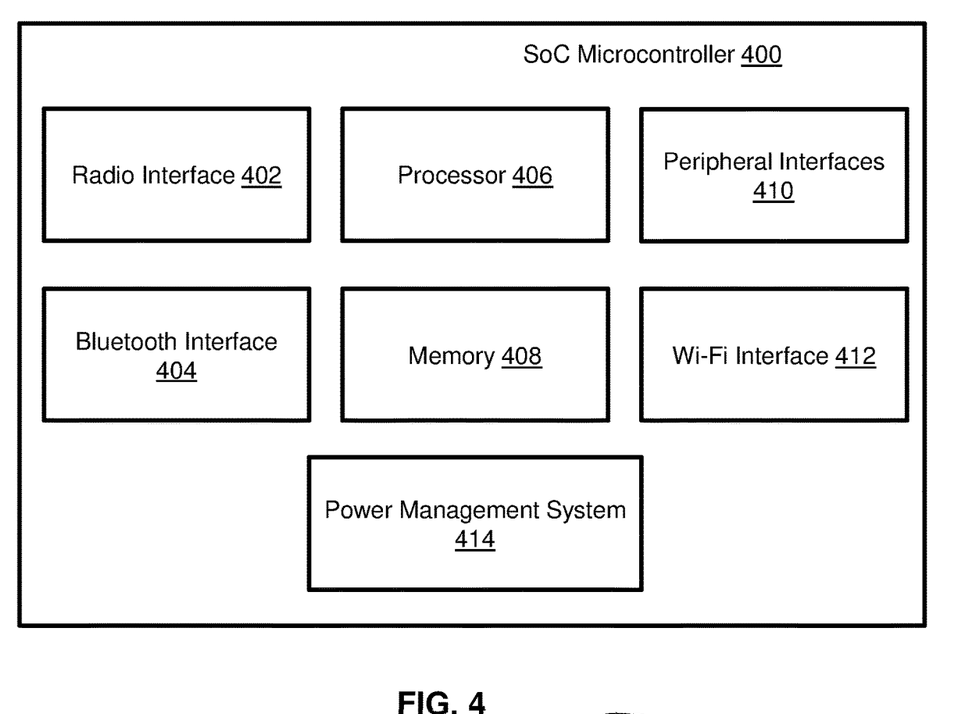
FIG. 4 is a block diagram illustrating a system on a chip (SoC) microcontroller, according to an embodiment of the present invention.

FIG. 4 is a block diagram illustrating the first SoC microcontroller 202/the second SoC microcontroller 302, according to an embodiment of the present invention. In one example, the SoC microcontroller 400 includes a radio interface 402, a Bluetooth interface 404, a processor 406, a memory 408, one or more peripheral interfaces 410, a Wi-Fi interface 412, and a power management system 414. In one example, the radio interface 402 includes radio frequency (RF) transmitter and RF receivers. The RF transmitters are used for transmitting the sensor data to the computing device 108 and RF receivers are used for received the feedback data from the computing device 108.

Further, the Bluetooth interface 404 and the Wi-Fi interface 412 support a range of wireless connectivity options, including 802.11b/g/n/e/i Wi-Fi, Bluetooth 4.2, BLE, and support for antenna diversity. This enables the SoC microcontroller 400 to connect to the internet, other devices, and other wireless networks. Further, one or more peripheral interfaces 410 includes a variety of peripheral interfaces that allow it to communicate with other devices and peripherals, such as sensors, displays, and other components. These interfaces include UART, I2C, I2S, SPI, CAN, USB, ADC, DAC, PWM, and more. Further, the processor 406 is the central processing unit of the SoC microcontroller 400 and is responsible for executing instructions and performing arithmetic and logic operations. In one example, the SoC microcontroller 400 uses a dual-core 32-bit Xtensa LX6 microprocessor, with one core optimized for real-time tasks and the other for high-throughput applications.

In one example, the memory 408 includes SRAM and ROM to store data and program code. SRAM is used for storing dynamic data, while ROM is used for storing firmware and other read-only data. In an example, the power management system 414 has a variety of power-saving modes and wake-up sources to conserve power and extend battery life. In an example, the SoC microcontroller 400 includes JTAG and UART interfaces for debugging and firmware updates, which makes it easier to develop and debug code on the device.

Figure 5:
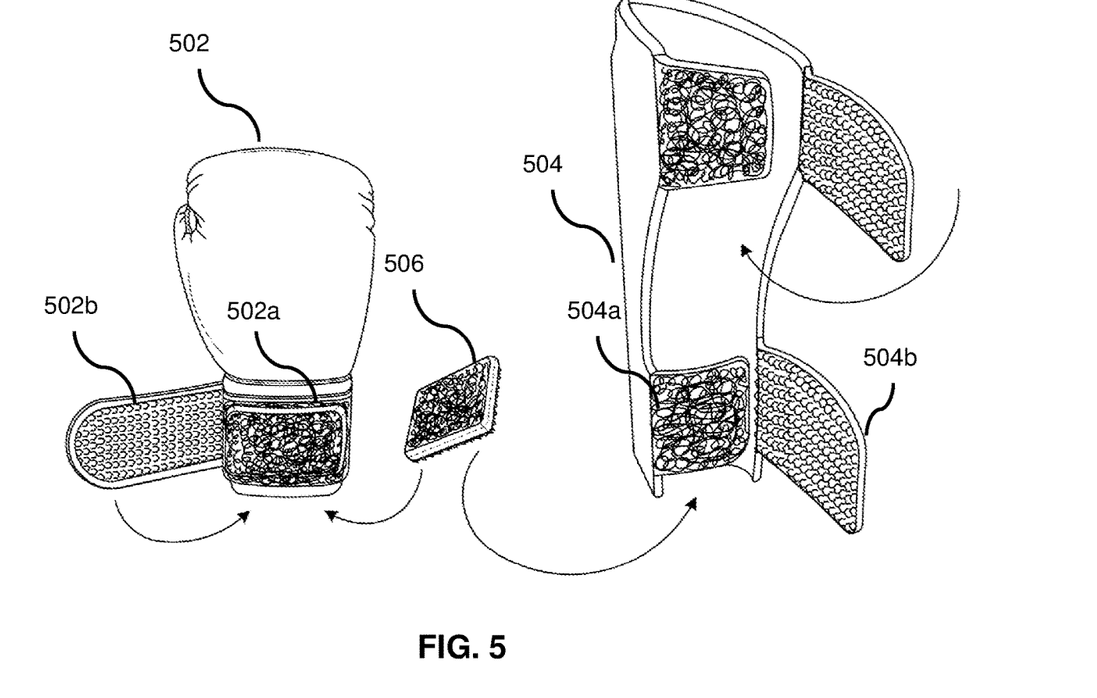
FIG. 5 illustrates a general implementation of attaching the tracking device to an object, according to an embodiment of the present invention.

FIG. 5 illustrates general implementation of attaching the first tracking device 200 to the first object 502, for example, boxing glove, according to an embodiment of the present invention. In an embodiment, the first tracking device 200 can be kept inside a double-sided Velcro pouch 506 or hook-and-loop pouch 506. One side of the Velcro pouch 506 can be attached to a Velcro portion 502a of the first object 502 and other side of the Velcro pouch 506 can be attached to a hook and loop closure 502b of the first object 502. Hence, the first tracking device 200 can be easily detached from the first object 502. Further, extended portion of the hook and loop closure 502b of the first object 502 can be attached to the extended portion of the Velcro portion 502a to keep the Velcro pouch 506 in a sandwiched fashion. Similarly, for a shin guard 504, one side of the Velcro pouch 506 can be attached to a Velcro portion 504a of the shin guard 504 and other side of the Velcro pouch 506 can be attached to a hook and loop closure 504b of the shin guard 504. In an embodiment, the size of the Velcro pouch 506 is significantly smaller than the size of the Velcro portion 502a of the first object 502, hook and loop closure 502b of the first object 502. Similarly, the size of the Velcro pouch 506 is significantly smaller than the length of the Velcro portion 504a of the shin guard 504, hook and loop closure 504b of the shin guard 504. This variation works best with a flexible PCB so that the user does not feel the device and it doesn't interfere with the movement.

Figure 6:
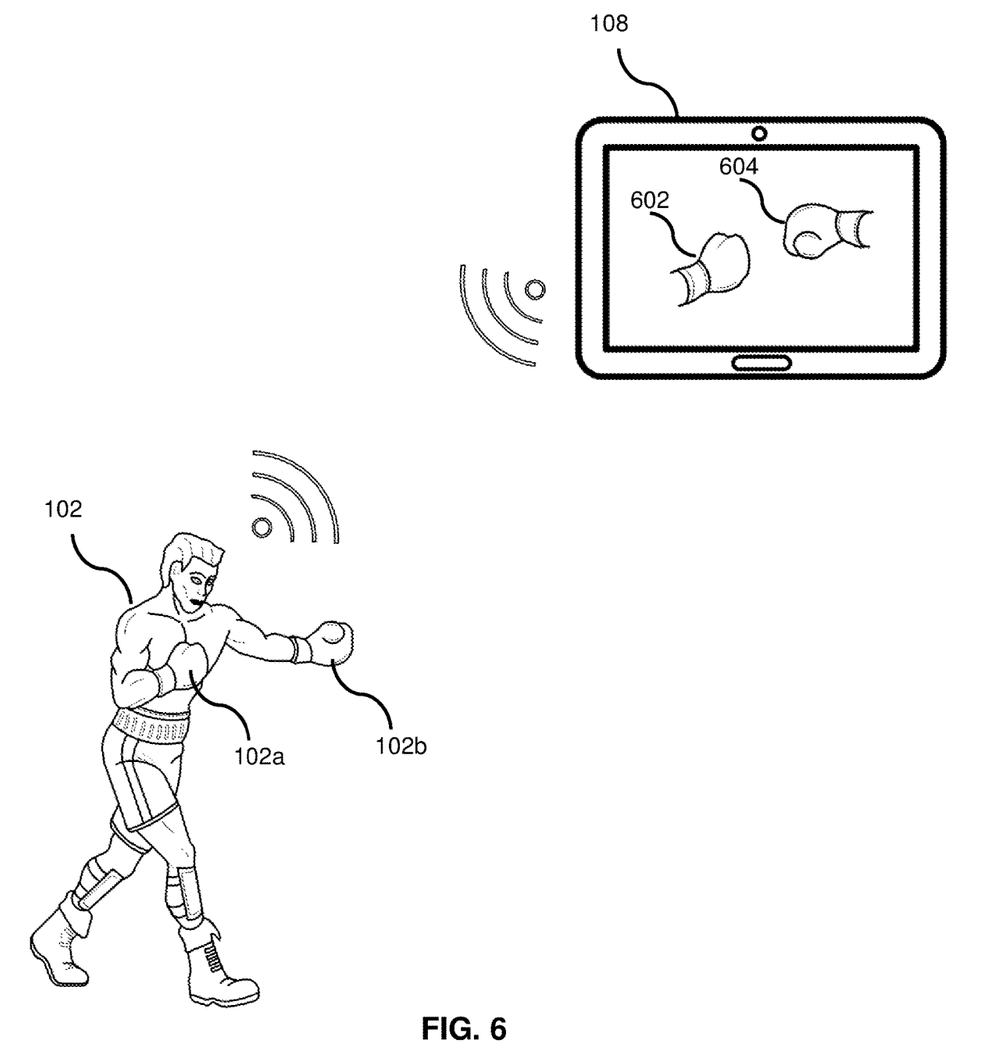
FIG. 6 illustrates a general implementation of displaying virtual objects corresponding to the object in a virtual environment presented on the computing device, according to an embodiment of the present invention.

FIG. 6 illustrates general implementation of displaying virtual objects 602 & 604 corresponding to the objects in a virtual environment presented on the computing device 108, according to an embodiment of the present invention. In an example, the virtual object 602 corresponds to the object 102a, for example, left hand glove. Similarly, the virtual object 604 corresponds to the object 102b, for example, right hand glove. As discussed above, the data analysis software resides on the computing device 108 compares the value the sensor data with the threshold value and determines the relative distance between the two objects 102a and 102b. This analysed data is sent to the visualization engine that displays data representing virtual objects 602 and 604 corresponding to the first object 102a and the second object 102b. The visualization engine can be a part of the computing device 108 or a part of another device 104.

In an embodiment, the virtual objects 602 & 604 are rendered in the virtual environment in a manner that the first virtual object 602 and the second virtual object 604 are centered around the origin of a three-dimensional (3D) Cartesian plane. In an embodiment, only the objects, for example, gloves/shin guards would be rendered. Relative movement of the two objects 102a and 102b impacts the position of the virtual objects 602 & 604 on the virtual environment.

Figure 7:
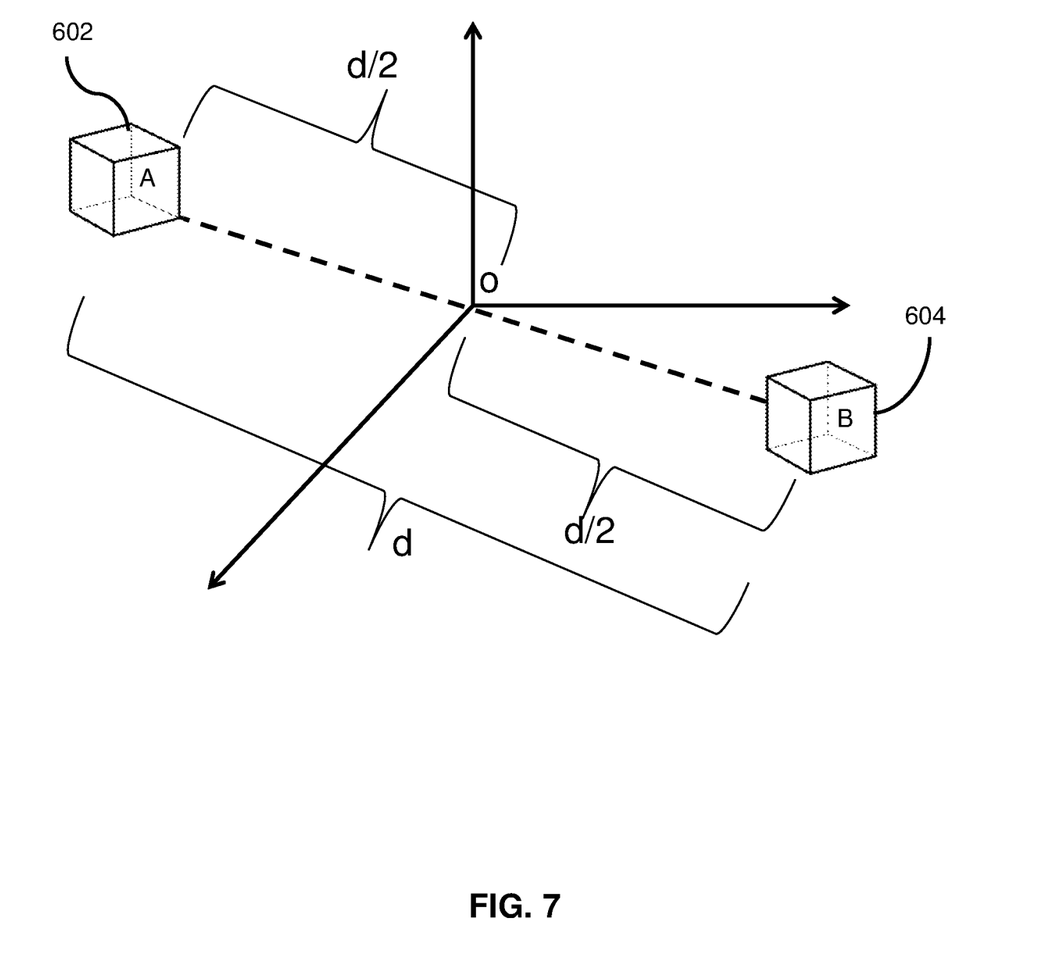
FIG. 7 illustrates a three-dimensional (3D) Cartesian plane where a first virtual object and a second virtual object are centered around the origin, according to an embodiment of the present invention.

FIG. 7 illustrates the three-dimensional (3D) Cartesian plane where the first virtual object 602 and the second virtual object 604 are centered around the origin named as 'O', according to an embodiment of the present invention. For illustration purpose, the first virtual object 602 and the second virtual object 604 are represented by the cubes 602 & 604. In a three-dimensional Cartesian coordinate system, a point is represented by a triplet of numbers (x, y, z), where x, y, and z represent the horizontal, vertical, and depth positions of the point, respectively. The origin (0, 0, 0) is the point at which the x, y, and z axes intersect.

Consider a scenario where magnetic field strength falls off with the square of the distance. By moving a small and known amount towards or away from the magnet 208, the system 100 can calculate the distance between the two objects (i.e., distance between the magnetometer 308 and the magnet 208) by determining the magnetic field strength changed over the know distance between the two measurements. For example, if the magnetometer 308 moved 1 m closer to a magnet 208 and the magnetic field strength quadrupled, then the magnet 208 must have been 2 m away from the original measuring point. Similarly, if the field strength only doubled, then the magnetometer 308 moved 1/sqrt(2) closer to the magnet 208. The 1 m closer was therefore 0.29 of the distance to the magnet 208, which means the magnet 208 was 3.4 m from the original measurement. This provides relative distance between the first virtual object 602 and the second virtual object 604.

In an embodiment, the magnetic field strength depends on the type of the magnet 208, shape of the magnet 208, and size of the magnet 208. As shown in FIG. 7, the distance between the first virtual object 602 and the Origin 'O' is d/2 and the distance between the second virtual object 604 and the Origin 'O' is d/2. This indicates the first virtual object 602 and the second virtual object 604 are centered around the origin 'O'. In an embodiment, the magnet is the electromagnet, and the magnetic field strength depends on the current flows into the electromagnet.

Figure 8:
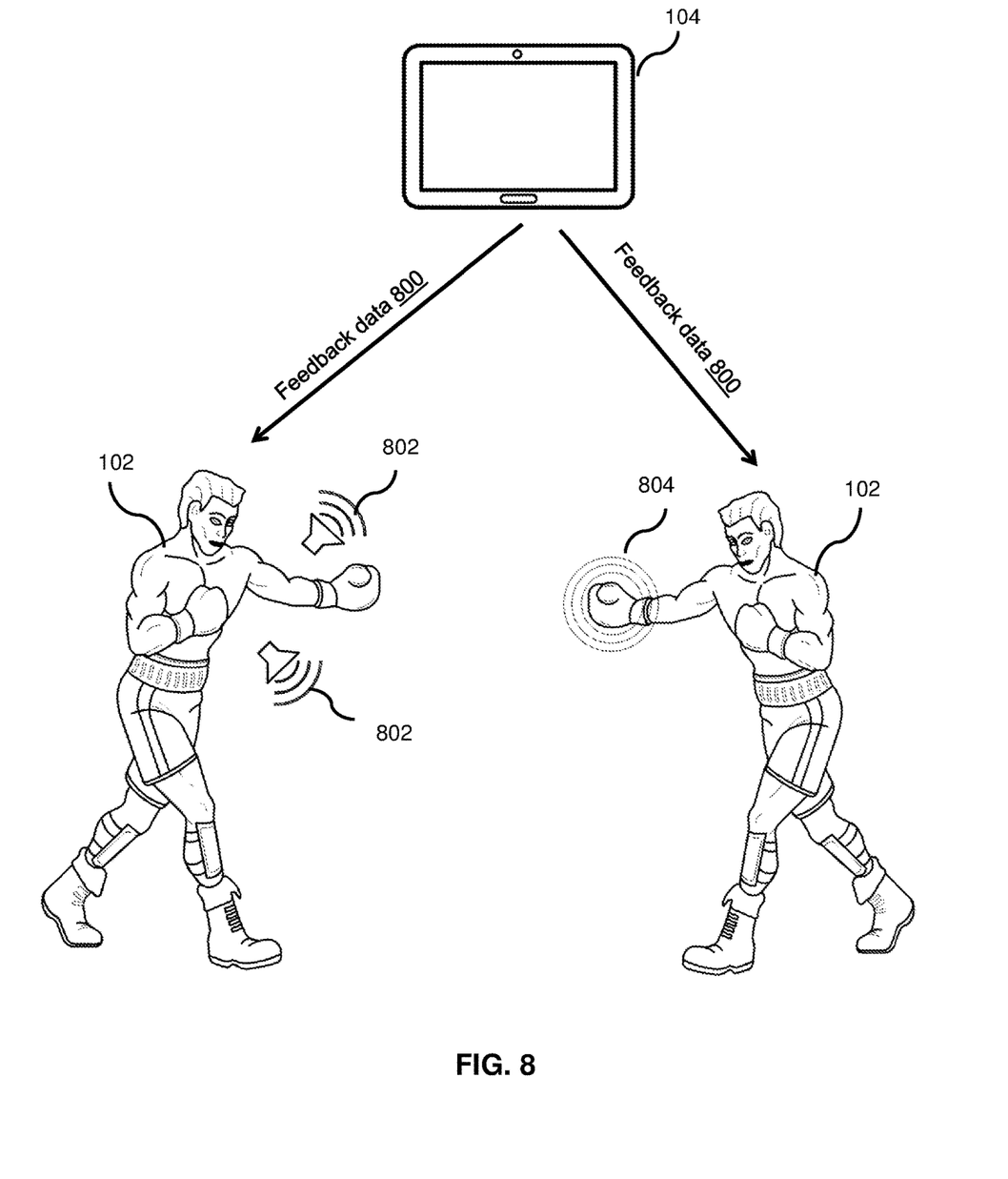
FIG. 8 illustrates an example of receiving real time feedback by a user when some behaviour of interest is detected, according to an embodiment of the present invention.

FIG. 8 illustrates an example of receiving real time feedback data 800 by the user 102 when some behaviour of interest is detected, according to an embodiment of the present invention. As discussed above, the data analysis software resides on the computing device 108 compares the value the sensor data with the threshold value and determines the relative distance between the two objects 102a and 102b. This analysed data can be used by the data analysis software for detecting some behaviour of interest. When a behaviour of interest is determined, the real time feedback data 800 corresponding to the behaviour of interest is sent to the first tracking device 200 and/or the second tracking device 300. Examples of behaviour of interest includes, but not limited to uncovered face, and hands in down position. When used in a sport application, the system 100 can be equipped with the feedback module such as sound/vibration generating device. Furthermore, the computing device 108 or the one or more devices 104 can be used for feedback. For example, a smartphone is used as the computing/visualization device. The user can create a custom scenario about which he/she wants to be notified. The phone screen can be used as a visual signalling device, the phone speaker can be used as an audio feedback system or the headphones (maybe wireless) that are paired to the phone can also be used.

Figure 9:
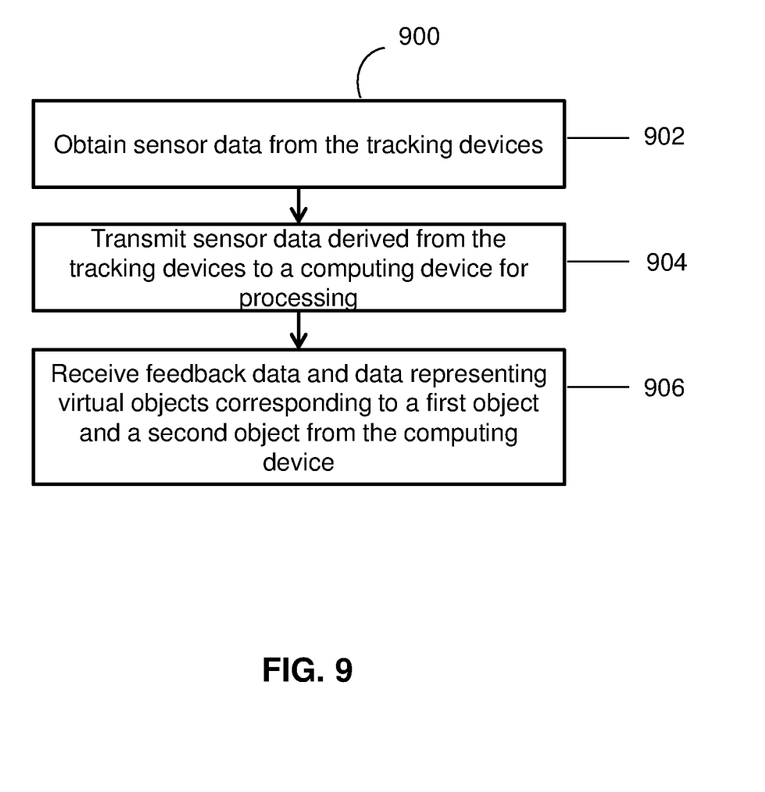
FIG. 9 illustrates a flow diagram of a method for tracking the two objects in relative motion to each other, according to an exemplary embodiment of the present invention.

FIG. 9 illustrates a flow diagram 900 of a method for tracking the two objects 102a & 102b in relative motion to each other, according to an exemplary embodiment of the present invention. At step 902, the method includes obtaining first sensor data from the first tracking device 200 and second sensor data from the second tracking device 300. The method allows the first SoC microcontroller 202 to obtain the first sensor data and the second SoC microcontroller 302 to obtain the second sensor data.

At step 904, the method includes transmitting the sensor data derived from the first sensor data and the second sensor data to the computing device 108 for processing to generate at least feedback data and data representing virtual objects 602 & 604 corresponding to the first object 102a and the second object 102b. The method allows the first SoC microcontroller 202 & the second SoC microcontroller 302 to transmit the sensor data derived from the first sensor data and the second sensor data to the computing device 108 for processing to generate at least feedback data and data representing virtual objects 602 & 604 corresponding to the first object 102a and the second object 102b.

At step 906, the method includes receiving the feedback data 800 and data representing virtual objects 602 & 604 corresponding to the first object 102a and the second object 102b from the computing device 108. The method allows the first tracking device 200 & the second tracking device 300 to receive the feedback data 800 and data representing virtual objects 602 & 604 corresponding to the first object 102a and the second object 102b from the computing device 108.

The various actions, acts, blocks, steps, or the like in the flow diagram may be performed in the order presented, in a different order or simultaneously. Further, in some embodiments, some of the actions, acts, blocks, steps, or the like may be omitted, added, modified, skipped, or the like without departing from the scope of the invention.

Figure 10:
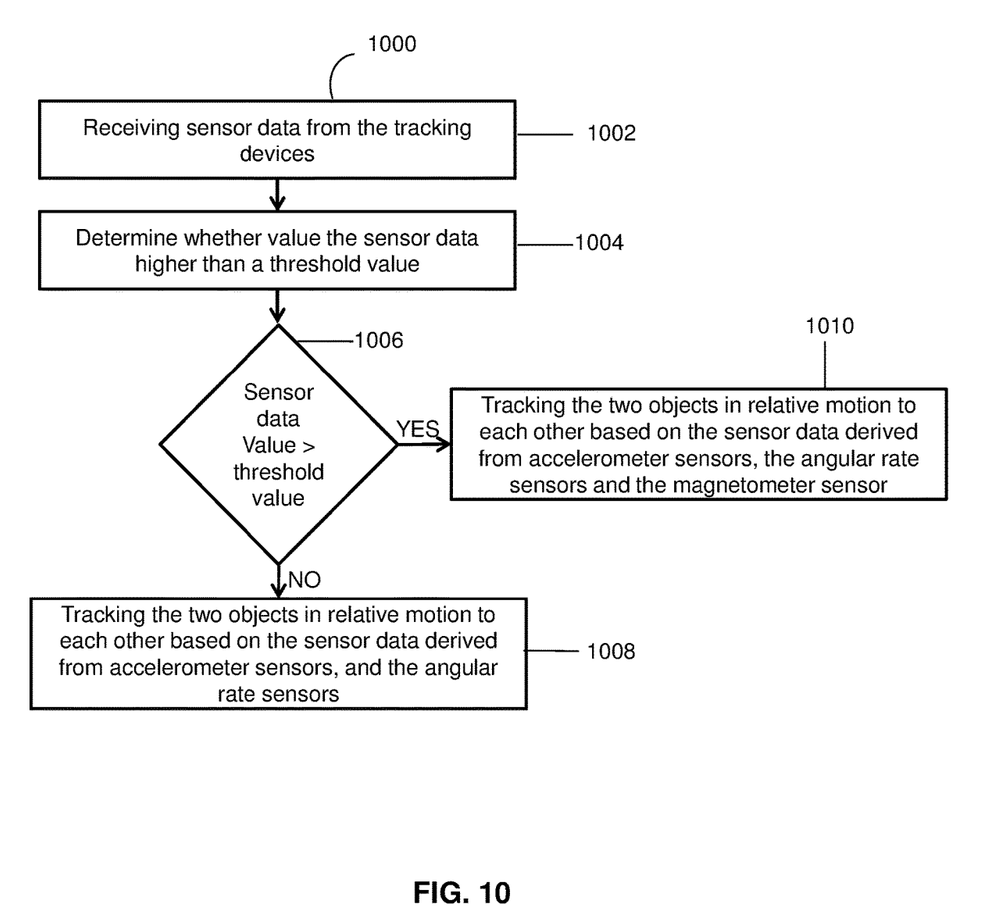
FIG. 10 illustrates a flow diagram of a method for processing the sensor data at the computing device, according to an exemplary embodiment of the present invention.

FIG. 10 illustrates a flow diagram 1000 of a method for processing the sensor data at the computing device 108, according to an exemplary embodiment of the present invention. In an embodiment, the computing device 108 may be a cloud computing device. At step 1002, the method includes receiving the sensor data from the first tracking devices 200 & the second tracking device 300. The method allows the computing device 108 to receive the sensor data from the first tracking devices 200 & the second tracking device 300. At step 1004, the method includes determining whether the value the sensor data is higher than the threshold value. The method allows the computing device 108 to determine whether the value the sensor data is higher than the threshold value.

If it is determined, at step 1006, that the value of the magnetometer sensor reading is higher than the threshold value, then at step 1010, the method includes tracking the two objects 102a & 102b in relative motion to each other based on the sensor data derived from the first accelerometer sensor 204, the second accelerometer sensor 304, the first angular rate sensor 206, the second angular rate sensor 306 and the magnetometer sensor 308. The method allows the computing device 108 to track the two objects 102a and 102b in relative motion to each other based on the sensor data derived from the first accelerometer sensor 204, the second accelerometer sensor 304, the first angular rate sensor 206, the second angular rate sensor 306 and the magnetometer sensor 308.

If it is determined, at step 1006, that the value of the magnetometer sensor reading is lower than the threshold value, then at step 1008, the method includes tracking the two objects 102a & 102b in relative motion to each other based on the sensor data derived from the first accelerometer sensor 204, the second accelerometer sensor 304, the first angular rate sensor 206, and the second angular rate sensor 306. The method allows the computing device 108 to track the two objects 102a & 102b in relative motion to each other based on the sensor data derived from the first accelerometer sensor 204, the second accelerometer sensor 304, the first angular rate sensor 206, and the second angular rate sensor 306.

The various actions, acts, blocks, steps, or the like in the flow diagram may be performed in the order presented, in a different order or simultaneously. Further, in some embodiments, some of the actions, acts, blocks, steps, or the like may be omitted, added, modified, skipped, or the like without departing from the scope of the invention.

Figure 11:
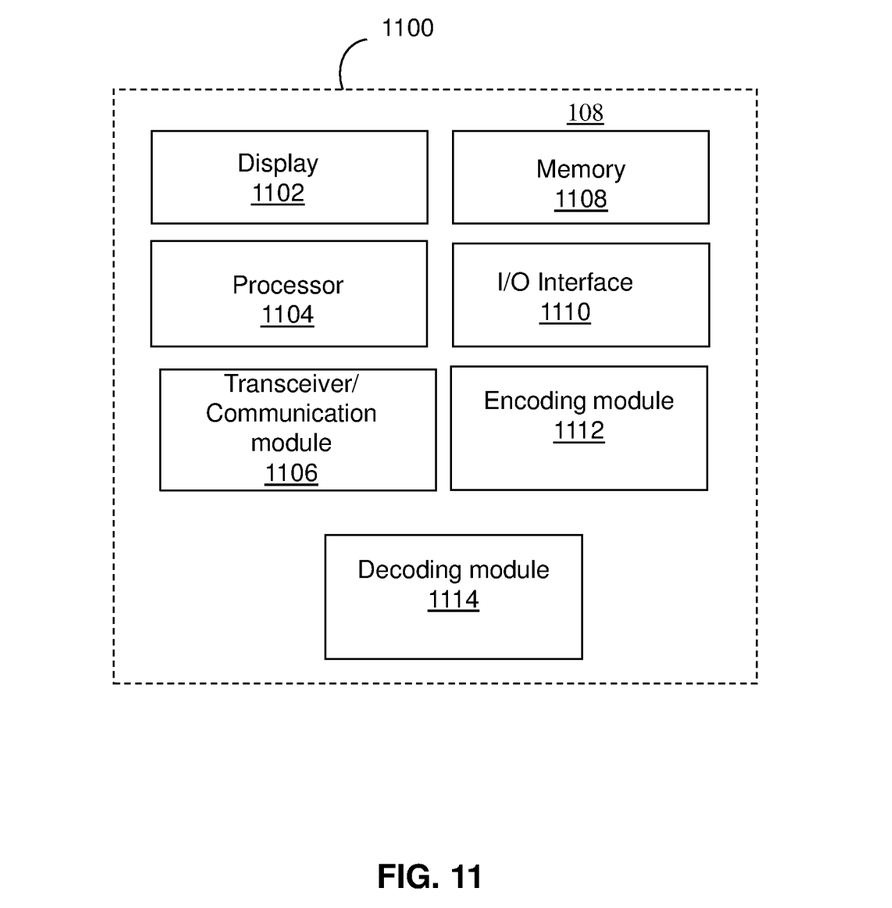
FIG. 11 is a block diagram illustrating the computing device, according to an exemplary embodiment of the present invention.

FIG. 11 is a block diagram 1110 illustrating the computing device 108, according to an exemplary embodiment of the present invention. In accordance with an example implementation, as shown in FIG. 11, the computing device 108 may include at least a processor 1104, a memory 1108, a transceiver or communication module 1106, one or more I/O interfaces, such as an I/O interface 1110, and a display 1102.

The processor 1104 may be communicably coupled with the transceiver/communication module 1106 to receive the sensor data from the first tracking device 200 and the second tracking device 300. Further, the transceiver 1106 may be configured to transmit feedback data 800 and the data representing virtual objects 602 and 604 corresponding to the first object 102a and the second object 102b. The processor 1104 is in communication with the memory 1108, configured in the form of routines, programs, objects, components, data structures and the like, which perform particular tasks to be executed by the processor 1108. The system 1100 may be connected to other information processing devices by using the I/O interface 1110. The display 1102 may be utilized to display virtual objects 602 & 604 as disclosed above. The I/O interfaces 1110 may include a variety of software and hardware interfaces, for instance, interface for peripheral device(s) such as a keyboard, a mouse, a scanner, an external memory, a printer and the like.

In an embodiment, the processor 1104 may include different types of processors known in the art including neural network-based algorithms that are effectively used in several applications.

The proposed system and method tracking the relative motion of two or more objects in 3D space may be applicable to different scenarios. Generally, the proposed method applies to tracking objects which frequently come back to close to their initial position. Examples may include boxing, where starting from a defensive position with the hands up and close to the head, going into the punch and then coming back to the initial defensive position. Another example may be machinery or robotic applications, where industrial robot arm picks up a part at the origin location, moving the arm out to place the component somewhere else and coming back to the original position. Yet another example may be droning swarm tracking, where one drone designated as the reference drone carrying the magnet and other drones orienting themselves in 3D space around the main drone using this method. Yet another example may be VR/AR applications, where limbs can be tracked without the use of base stations. Yet another example may be any application where object tracking is required but the nature of the action is such that the visual view of the object needed to be tracking is occluded, for example, inserting a medical tool into the body, inserting a probe into a machinery part, guiding a drill into a cavity.

The proposed system and method provides many advantages over the existing methods and systems. The proposes system provides an improved data capture and analysis system that does not interfere with a user's actions. Further, the proposed tracking device can be easily attached to the objects via the double-sided Velcro pouch. Further, the proposed tracking device can be easily detached from the objects. Further, the relative distance between the objects can be easily determined and corresponding movements can be easily presented in the virtual space through the virtual objects. Furthermore, the proposed system provides an effective feedback mechanism to alert the user during a practice session. In conventional methods base stations are used for tracking objects in 3D space. This proposed system is focused on tracking objects without the use of base stations. The primary benefit being the ability to operate when the view is occluded and not requiring the setup of external base stations. The proposed system provides a method for frequent and accurate drift compensation. The drift compensation method provided in this invention is unique in the sense that it aims to minimize the time spent accumulating the drift error whereas other methods seek to minimize the overall accumulation of drift error (by including constraints such as number of sensors, their placement, so that the model can more constrained/bound)

Although particular embodiments of the invention have been described in detail for purposes of illustration, various modifications and enhancements may be made without departing from the spirit and scope of the invention.

What is claimed is:

1. A system, comprising: a first tracking device attachable to a first object worn on a first body part of a user, wherein the first tracking device comprises at least a first system on a chip (SoC) microcontroller, a first group of sensors, and a magnet; a second tracking device attachable to a second object worn on a second body part of the user, wherein the second tracking device comprises at least a second system on a chip (SoC) microcontroller, a second group of sensors;

wherein a first processor of the first SoC microcontroller of the first tracking device configured to obtain a first sensor data from the first group of sensors; wherein a second processor of the second SoC microcontroller of the second tracking device configured to obtain a second sensor data from the second group of sensors; and wherein a first transmitter of the first SoC microcontroller and a second transmitter of the second SoC microcontroller configured to transmit the first sensor data and the second sensor data derived from the first group of sensors and the second group of sensors to a computing device for processing to generate at least feedback data and data representing virtual objects corresponding to the first object and the second object, the virtual objects being capable of rendered in a virtual environment presented on one or more devices; wherein the processing of the first sensor data and the second sensor data at the computing device comprises: receiving the first sensor data and the second sensor data derived from the first group of sensors and the second group of sensors; determining whether a value of a magnetometer sensor reading from the second sensor data is higher than a threshold value; if it is determined that the value of the magnetometer sensor reading is higher than the threshold value, tracking position data of the first object and the second object in relative motion to each other based on the magnetometer sensor reading from the second sensor data, and tracking orientation data of the first object and the second object in relative motion to each other based on a sensor data derived from the first accelerometer sensor, the second accelerometer sensor, the first angular rate sensor, and the second angular rate sensor; if it is determined that the value of the magnetometer sensor reading is lower than the threshold value, the tracking position data, and the orientation data of the first object and the second object in relative motion to each other based on a sensor data derived from the first accelerometer sensor, the second accelerometer sensor, the first angular rate sensor, and the second angular rate sensor; and if it is determined that the value of the magnetometer sensor reading is higher than the threshold value, tracking the position data of the first object and the second object in relative motion to each other based on a sensor data derived from the first accelerometer sensor, the second accelerometer sensor, the first angular rate sensor, the second angular rate sensor, and the magnetometer sensor, and tracking the orientation data of the first object and the second object in relative motion to each other based on a sensor data derived from the first accelerometer sensor, the second accelerometer sensor, the first angular rate sensor, and the second angular rate sensor.

2. The system of claim 1, wherein the first object and the second object worn on the first and second body part of the user comprises at least gloves, shin guards, leg guards, a helmet, a wristband a headband or other article that can be worn.

3. The system of claim 1, wherein the first group of sensors comprises at least a first accelerometer sensor, and a first angular rate sensor.

4. The system of claim 1, wherein the second group of sensors comprises at least a second accelerometer sensor, a second angular rate sensor, and a magnetometer sensor.

5. The system of claim 1, wherein the magnet is an electromagnet.

6. The system of claim 1, wherein the magnet is a conventional dipole magnet.

7. The system of claim 1, wherein the processing of the first and second sensor data at the computing device further comprising tracking the location of the first and second object relative to a magnet or electromagnet using a periodic drift compensation performed by calculating direction and distance of the first and second object being tracked with respect to the magnet or electromagnet using magnetic field strengths.

8. The system of claim 1, further comprising generating the data representing virtual objects corresponding to the first and second objects based on the tracking data of the first and second objects in relative motion to each other, wherein the virtual objects are capable of being rendered in the virtual environment presented on the one or more devices.

9. The system of claim 1, wherein the threshold value depends on the type of the magnet, the shape of the magnet, size of the magnet, and the current inflow and shape of the electromagnet.

10. The system of claim 8, wherein the virtual objects rendered in the virtual environment in a manner that comprises
 the first virtual object and the second virtual object are centered around the origin of a three-dimensional (3D) Cartesian plane; or
 the first virtual object is centered at the origin and the second virtual object is on any plane of the 3D Cartesian plane.

11. The system of claim 1, further comprising a feedback module configured to provide feedback to the user during a user's session.

12. The system of claim 11, wherein the feedback is provided corresponding to a behaviour of interest.

13. The system of claim 12, wherein the feedback corresponding to the behaviour of interest can be customized by the user in an application related to the tracking system.

14. The system of claim 11, wherein the feedback comprises at least one of an audio feedback, a visual feedback, and a tactile feedback.

15. A method for tracking at least a first object and a second object in relative motion to each other, comprising: obtaining a first sensor data from a first tracking device, wherein the first tracking device attachable to a first object worn on a first body part of a user, wherein the first tracking device comprises at least a first system on a chip (SoC) microcontroller, a first group of sensors, and a magnet, wherein the first sensor data is obtained, by a first processor of the first SoC microcontroller of the first tracking device, from the first group of sensors; obtaining a second sensor data from a second tracking device, wherein the second tracking device attachable to a second object worn on a second body part of the user, wherein the second tracking device comprises at least a second system on a chip (SoC) microcontroller, and a second group of sensors, wherein the second sensor data is obtained, by a second processor of the second SoC microcontroller of the second tracking device, from the second group of sensors; transmitting the first sensor data and the second sensor data derived from the first sensor data and the second sensor data to a computing device for processing to generate at least feedback data and data representing virtual objects corresponding to the first object and the second object, the virtual objects capable of being rendered in a virtual environment presented on one or more devices; and receiving the feedback data and data representing virtual objects corresponding to the first object and the second object from the computing device; wherein the processing of the first sensor data and the second sensor data at the computing device comprising: receiving the first sensor data and the second sensor data derived from the first group of sensors and the second group of sensors; determining whether a value of a magnetometer sensor reading from the second sensor data is higher than a threshold value;

if it is determined that the value of the magnetometer sensor reading is higher than the threshold value, tracking position data of the first object and the second object in relative motion to each other based on the magnetometer sensor reading from the second sensor data, and tracking orientation data of the first object and the second object in relative motion to each other based on a sensor data derived from the first accelerometer sensor, the second accelerometer sensor, the first angular rate sensor, and the second angular rate sensor; if it is determined that the value of the magnetometer sensor reading is lower than the threshold value, the tracking position data, and the orientation data of the first object and the second object in relative motion to each other based on a sensor data derived from the first accelerometer sensor, the second accelerometer sensor, the first angular rate sensor, and the second angular rate sensor; and if it is determined that the value of the magnetometer sensor reading is higher than the threshold value, tracking the position data of the first object and the second object in relative motion to each other based on a sensor data derived from the first accelerometer sensor, the second accelerometer sensor, the first angular rate sensor, the second angular rate sensor, and the magnetometer sensor, and tracking the orientation data of the first object and the second object in relative motion to each other based on a sensor data derived from the first accelerometer sensor, the second accelerometer sensor, the first angular rate sensor, and the second angular rate sensor.

16. The method of claim 15, wherein the first object and the second object worn on the first and second body part of the user comprises at least gloves, shin guards, leg guards, a helmet, a wristband a headband or other article that can be worn.

17. The method of claim 15, wherein the first group of sensors comprises at least a first accelerometer sensor, and a first angular rate sensor.

18. The method of claim 15, wherein the second group of sensors comprises at least a second accelerometer sensor, a second angular rate sensor, and a magnetometer sensor.

19. The method of claim 15, wherein the magnet is an electromagnet or a conventional dipole magnet.

20. The method of claim 15, wherein the processing of the first and second sensor data at the computing device further comprising tracking the location of the first and second object relative to a magnet or electromagnet using a periodic drift compensation performed by calculating direction and distance of the first and second object being tracked with respect to the magnet or electromagnet using magnetic field strengths.

21. The method of claim 15, further comprising generating the data representing virtual objects corresponding to the first and second objects based on the tracking data of the first and second objects in relative motion to each other, wherein the virtual objects are capable of being rendered in the virtual environment presented on the one or more devices.

22. The method of claim 15, wherein the threshold value depends on the type of the magnet, the shape of the magnet, size of the magnet, and the current inflow and shape of the electromagnet.

23. The method of claim 21, wherein the virtual objects rendered in the virtual environment in a manner that comprises
the first virtual object and the second virtual object are centered around the origin of a three-dimensional (3D) Cartesian plane; or
the first virtual object is centered at the origin and the second virtual object is on any plane of the 3D Cartesian plane.

24. The method of claim 15, further comprising a feedback module configured to provide feedback to the user during a user's session.

25. The method of claim 24, wherein the feedback is provided corresponding to a behaviour of interest.

26. The method of claim 25, wherein the feedback corresponding to the behaviour of interest can be customized by the user in an application related to the tracking system.

27. The method of claim 24, wherein the feedback comprises at least one of audio feedback, visual feedback, and tactile feedback.

* * * * *